United States Patent [19]

Watanabe

[11] Patent Number: 5,761,128
[45] Date of Patent: Jun. 2, 1998

[54] NON-VOLATILE SEMICONDUCTOR MEMORY DEVICE

[75] Inventor: Kazuo Watanabe, Tokyo, Japan

[73] Assignee: NEC Corporation, Tokyo, Japan

[21] Appl. No.: 827,056

[22] Filed: Mar. 26, 1997

[30] Foreign Application Priority Data

Mar. 28, 1996 [JP] Japan .................... 8-074087

[51] Int. Cl.$^6$ ........................................... G11C 13/00
[52] U.S. Cl. ................ 365/189.01; 365/201; 365/210
[58] Field of Search ......................... 365/189.01, 201, 365/210

[56] References Cited

U.S. PATENT DOCUMENTS 5,212,442 5/1993 O'Toole ............................ 365/201

FOREIGN PATENT DOCUMENTS 59-144098  8/1984  Japan .
62-37479   8/1987  Japan .

*Primary Examiner*—Terrell W. Fears
*Attorney, Agent, or Firm*—Young & Thompson

[57] ABSTRACT

An EPROM has a main memory cell block, test memory cell block and a redundant memory cell block in a memory cell array. The test memory cell block stores a test pattern for a device test after fabrication and a signature code including a maker code and a device code. If some memory cell group in the main memory cell block are substituted for by memory cell group in the redundant memory cell block, the corresponding bit of the signature code is generated by a signature code generator in accordance with the data for the faulty group. The signature code generator selects data read from the redundant memory cell block or the generated bit of the signature code depending on the mode of the memory device.

4 Claims, 6 Drawing Sheets

|  | D0 | D1 | D2 | D3 | D4 | D5 | D6 | D7 |  |
|---|---|---|---|---|---|---|---|---|---|
| MAKER CODE | 0 | 0 | 0 | 0 | 1 | 0 | 0 | 0 | ← A0=LOW |
| DEVICE CODE | 0 | 0 | 0 | 1 | 1 | 0 | 1 | 1 | ← A0=HIGH |

NON-VOLATILE SEMICONDUCTOR MEMORY DEVICE

BACKGROUND OF THE INVENTION (a) Field of the Invention

The invention relates to a non-volatile semiconductor memory device and, in particular, to an improvement for storing a signature code in a non-volatile semiconductor memory device having a redundant memory cell block.

(b) Description of the Related Art

A conventional non-volatile semiconductor memory device such as an erasable and programmable read only memory device (EPROM) permits a program operation on the user side by using a programmer. The program algorithm and parameters to be used upon programming vary from maker to maker of the memory device. Accordingly, the programmer is required to identify a device maker to thereby select a program algorithm and parameters to be used upon programming specified for the particular memory device. A signature code is generally used as means for identifying the information representing such device maker, program algorithm and parameters. Specifically, by reading out a signature code recorded in the memory device, the programmer identifies the information relating to the device. Normally, a signature code is read out by applying a high voltage signal, which is higher than a supply voltage for the memory device.

FIG. 1 indicates a specific example of a signature code for a memory device having 8-bit, output pins. Address input pin A9 is selectively activated for providing the device information. Specifically, by applying a voltage of a low (L) level to an input pin A0 while applying a high voltage to an input pin A9, for example, a maker code (00001000) is delivered through output pins D0 to D7. Conversely, by applying a voltage of a high (H) level to the input pin A0, a device code (00011011) is delivered through the output pins D0 to D7.

FIG. 2 is a block diagram of a conventional EPROM, as an example of a conventional non-volatile semiconductor memory device. The EPROM comprises a memory cell array 11 including a main memory cell block 12, a redundant memory cell block 13, a test memory cell block 14 including memory cells, provided for respective columns in the main memory block 12, for providing a test pattern during an initial device test after fabrication, and a redundant test memory cell block 15 including memory cells provided for respective columns of the redundant memory cell block 13. A column or column block in the redundant memory cell block 13 and redundant test memory cell block 15 are used as a substitute for a particular column or column block in the main memory cell block 12 and test memory cell block 14, after it is found during a device test that a memory cell or bit line, for example, in the particular column or column block has a defect.

The EPROM further comprises a sense amplifier bank 16 which amplifies an output "A" read out from the main memory cell block 12, a redundant sense amplifier 17 which amplifies an output "D" read out from the redundant memory cell block 13 and the redundant test memory cell block 15, a transfer bank 21a which executes a switching between an output "B" from the sense amplifier bank 16 and an output "E" from the redundant sense amplifier 17 in response to a transfer switching signal RS or substitute signal, a signature code read mode detector 19a which receives a high voltage signal from the address input pin A9 and delivers a mode detection signal SS upon detecting the high voltage, a signature code generator bank 18a for controlling a switched output CA from the transfer bank 21a in response to the mode detection signal SS, and an output buffer bank 22 for receiving an output CB from the signature code generator bank 18a to deliver an amplified signal to output pins D0 to D7.

In the EPROM as described above, when a high voltage is supplied to the signature code read mode detector 9a from the address input pin A9, the mode detection signal SS which controls the signature code generator bank 18a becomes active, establishing a signature code read mode. When the mode detection signal SS is made active, the signature code generator bank 18a invalidates the signal CA which is received from the transfer bank 11a, and delivers a logic signature code generated in the signature code generator bank 18a as an output CB to the output buffer bank 22.

On the other hand, when the mode detection signal SS from the signature code read mode detector 19a is inactive or when the address input pin A9 does not assume a high voltage, the signature code generator bank 18a performs no operation relating to the generation of the signature code, but merely delivers data CA supplied from the transfer bank 21a to the output buffer bank 12.

FIG. 3 is a circuit diagram of the transfer gate bank 21a and the signature code generator bank 18a shown in FIG. 2. Each of the transfer sections 42, which form together the transfer gate bank 21a, comprises inverters 44 and 45 which receives a transfer switching signal at RS0, a first transfer gate which includes an N-channel and a P-channel MOSFETs (hereinafter referred to as NMOSFET and PMOSFET, respectively) 46 and 48 for receiving input B at SO0 and controlled by the level at RS0, and a second transfer gate which includes an NMOSFET 47 and a PMOSFET 49 for receiving input E at SOR and controlled by the level at RS0. The outputs of both the first and second transfer gates 46, 48 and 45, 49 are connected together for supplying a selected output CA.

Each of the signature code generators 43, which form together the signature code generator bank 18a, comprises a control signal generator 52 which generates a pair of signature logic control signals BS and TS in response to the mode detection signal SS, a first NAND gate 50 having a first input for receiving an output CA from the transfer sections 42 and a second input for receiving the output BS of the control signal generator 52, and a second NAND gate 51 having a first input connected to the output of the first NAND gate 50 and a second input for receiving the output TS of the control signal generator 52. NAND gates 50 and 51 control the output CA from the transfer gate section 42 in accordance with the control signals BS and TS to deliver data CB.

In operation, the transfer gate section 42 determines, in accordance with the logic level of the transfer switching signal at RS0, which one of data from the main memory cell block 12 and the redundant memory cell block 13 is to be delivered. During a normal operation mode, the signature logic control signals BS and TS both assume a H-level, and deliver a logic level which is the same as the level of data output CA from either the main memory cell block 12 or the redundant memory cell block 13 to an output pin Da0.

During a signature code read mode, the logic of the output Da0 is controlled in accordance with the signature logic control signals BS and TS. The output pin D0 shown in FIG. 1 delivers a L-level during the signature code read-out mode.

FIG. 4 is a circuit diagram of an example for the control signal generator 52 shown in FIG. 3. The control signal generator 52 comprises a NAND gate 53 having a first input for receiving the mode detection signal SS and a second input fixed to a high potential line to deliver BS signal, and a NAND gate 54 having a first input for receiving the mode detection signal SS and a second input fixed to the ground potential to deliver TS signal. With this configuration, the control signal generator 52 functions to generate signature logic control signals BS and TS for determining a logic level at the output pin DO shown in FIG. 1, and also to compare the mode detection signal SS against a supply voltage VCC and GND.

During the signature code read mode, the mode detection signal SS assumes a H-level as mentioned previously, while the signature logic control signals BS and TS assume a L-level and a H-level, respectively. As a consequence, the signature code generator 43 shown in FIG. 3 delivers a L-level at the output pin Da0 during the signature code read mode. A number of signature code generators 43 are provided which are equal in number to the number of bits read out from the memory device, and have specified bits for the signature code.

In the conventional non-volatile semiconductor memory device as described above, a signature code generator is required for each output pin. Since the number of I/O pins increases and a number of signature code generators must be provided which are equal in number to the number of I/O pins, the number of circuit elements increases, resulting in an increase in the occupied chip area. To alleviate the drawback of an increased chip area, another conventional memory device is proposed.

FIG. 5 is a circuit diagram of an EPROM during a signature code read mode, which is proposed in Patent Publication No. JPA-1987-37,479. The EPROM has a memory cell array including a plurality of sub-blocks 55 and 56 and a redundant memory cell block 57. Each of the sub-blocks 55 and 56 has memory cells each storing a common bit for a signature code, while the redundant memory cell block 57 has memory cells storing all of the bits S1 to S8 for the signature code. In this configuration, when a particular sub-block 55 or 56 is substituted for by the redundant memory cell block 57, the particular bit of the signature code corresponding to the substituted sub-block can be selected in the redundant memory cell block 57.

In the second conventional EPROM, while an increase in the chip area can be suppressed, the redundant memory cell block 57 must be divided into portions which are equal in number to the number of sub-blocks 55 and 56. Accordingly, the size of the redundant memory cell 57 is determined by the number of sub-blocks corresponding to the output bits. If the circuit arrangement is desired to have a small number of redundant memory cells, the reduction in number of the redundant memory cells is limited by a signature code and the number of output bits.

SUMMARY OF THE INVENTION

It is therefore an object of the invention to provide a non-volatile semiconductor memory device in which the number of circuit elements which are required to read out a signature code and an occupied chip area are reduced while allowing an optimum size of a redundant memory cell block to be selected.

In accordance with the present invention, there is provided a non-volatile semiconductor memory device comprising: an array of non-volatile memory cells including a main memory cell block, a test memory cell block for storing a signature code, and a redundant memory cell block; a signal read block including a first read section for reading data stored in the main memory cell block and the signature code stored in the test memory cell block, and a second read section for reading data stored in the redundant memory cell block; a mode selector for selecting a normal operation mode and a signature read mode of the memory device; a signal generator including a substitute signal generator for generating a substitute signal indicating that a specified faulty memory cell group in the main memory cell block be substituted for by the redundant memory cell block, and a logic control signal generator for generating a specified one of bits of the signature code based on the substitute signal during the signature read mode; and a data selecting block including a first selecting section for selecting one of an output from the first read section and an output from the second read section based on the substitute signal during the normal operation mode, and a second selecting section for selecting an output from the second read section or an output from the signature code generator dependently of the normal operation mode or signature code read mode.

With the non-volatile semiconductor memory device according to the invention, since it is not necessary to provide a signature code generator for each bit of the signature code, an optimum number of signature code generators can be selected as desired, so as to reduce the number of circuit elements and the chip area. Specifically, the signature code generator may be provided in number corresponding to the number of redundant columns in the redundant memory block.

DESCRIPTION OF THE PREFERRED EMBODIMENTS

Figure 6:
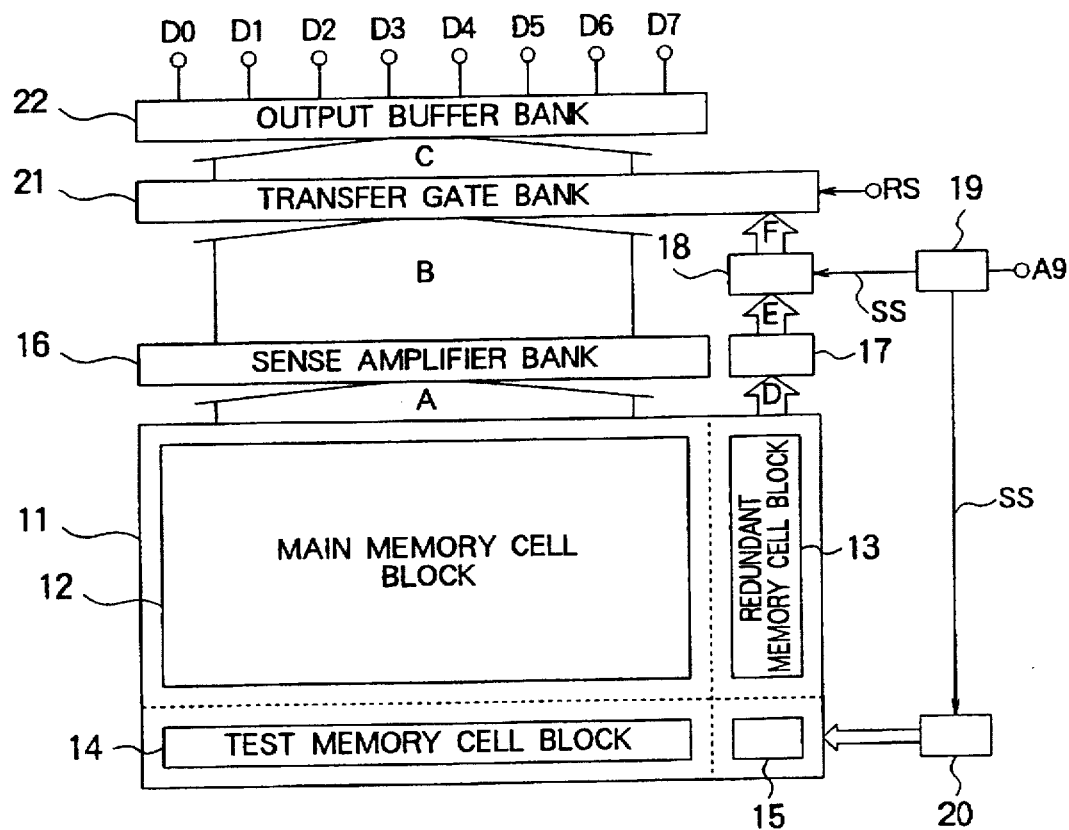
FIG. 6 is a block diagram of an EPROM according to an embodiment of the invention.

Referring to FIG. 6, an EPROM implementing a non-volatile semiconductor memory device according to an embodiment of the invention comprises a memory cell array 11 including a main memory cell block 12 for storing user data, a redundant memory cell block 13 for substituting for a part of the main memory cell block 12 having a defect, a test memory cell block 14 for providing a test pattern during a device test after fabrication, and a redundant test memory cell block 15 for substituting for a part of the test memory cell block 14 which is associated with the part of the main memory cell block 12 having the defect.

The EPROM further comprises a sense amplifier bank 16 and a redundant sense amplifier 17 which amplify data "A" and "D", respectively, read out from the memory cell array 11, a signature code read mode detector 19 for detecting a high voltage fed from an address input pin A9 to deliver a mode detection signal SS, an X-decoder 20 for the test memory cell block 14 and redundant memory cell block 15 for providing an access for a test pattern during a device test and a signature code during a signature code read mode, a signature code generator 18 for inactivating an output "E" from the redundant sense amplifier 17 in response to the mode detection signal SS, a transfer gate bank 21 for switching between an output "B" from the sense amplifier bank 16 and an output "F" from the signature code generator 18 in response to a switching signal RS or substitute signal, and an output buffer bank 22 for transmitting an output "C" from the transfer bank 21 to output pins D0 to D7.

The main memory cell block 12 in the memory cell array 11 comprises an array of memory transistors disposed in a matrix and each having a control gate and a floating gate to define a non-volatile semiconductor memory cell. Information (or data) is to be stored by injecting electric charge into the floating gate by a programmer on the user side. The test memory cell block 14 comprises an array of non-volatile semiconductor memory cells each having a configuration similar to that of the memory cells in the main memory cell block 12 and storing a specific bit of a test pattern and a specific data bit of a signature code. The redundant memory cell block 13 and the redundant test memory cell block 15 are provided to allow substitution for a column or column block of the non-volatile semiconductor cells which form the main memory cell block 12 and the test memory cell block 14 and has a defect therewith.

In the present embodiment, the sense amplifier bank 16 is provided for reading data "A" which is to be stored in the main memory cell block 12 and is stored in the test memory cell block 14, and delivers the read-out data "B". The redundant sense amplifier 17 is provided for reading data "D" which is to be stored in the redundant memory cell block 13 and is stored in the redundant test memory cell block 15, and delivers the read-out data "E". The signature code read mode detector 19 makes mode detection signal SS active, namely, at a high level, for effecting a signature code read mode, when a high voltage is applied through the input pin A9. When a high voltage is not applied, the mode detection signal SS remains inactive for effecting a normal operation mode.

The signature code generator 18 generates a signature logic control signal in accordance with the mode detection signal SS, and delivers data "F" by performing arithmetic on an output "E" from the redundant sense amplifier 17 in accordance with the signature logic control signal. The transfer bank 21 provides a switching between an output "S" from the sense amplifier bank 16 and an output "F" from the signature code generator 18 in accordance with the switching input RS to deliver an output "C", which is transmitted by the output buffer 22 to the output pins D0 to D7.

The present embodiment employs a configuration in which memory cells in the redundant memory cell block 13 are substituted for a part of the main memory cell block 12 in the memory cell array 11 after a device test finds a faulty memory cells or lines in the main memory block 12. After the substitution, data are read from the main memory block by the sense amplifier 16 and the redundant memory cell block by the redundant sense amplifier 17 during a normal operation mode.

Figure 7:
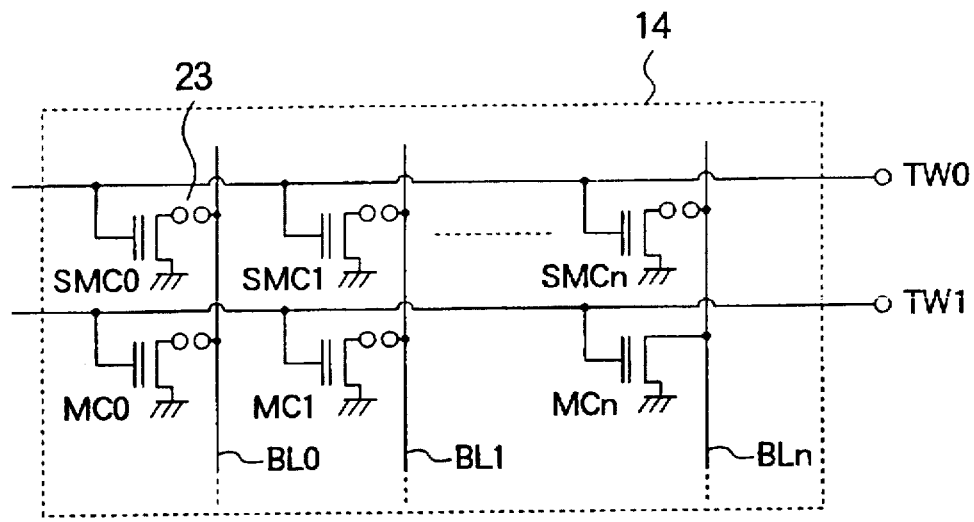
FIG. 7 is a circuit diagram of the test memory cell block shown in FIG. 6.

Referring to FIG. 7 illustrating the circuit configuration of the test memory cell block 14 shown in FIG. 6, the cell block 14 has a first row of memory cells SMC0 to SMCn for storing one of a signature code, i.e., maker code, a second row of test memory cells MC0 to MCn for storing the other of the signature code, i.e., device code, and a plurality of third rows of memory cells, not shown, for storing a plurality of test patterns, each of the memory cells including a control gate connected to a corresponding one of word lines TW0, TW1 etc. and a floating gate for storing charge thereon and connected to a corresponding one of bit lines DL0 to DLn at the drain of the each of the memory cells. However, the drains of some of memory cells in the first and second rows including memory cell SMC0, for example, are disconnected from the corresponding bit line as shown at numeral 23, thereby storing data "0" for the particular bits of the signature code. During the signature code read mode, only the word line TW0 or TW1 is maintained at a high level by the X-decoder, thereby selecting the first row or second row of memory cells which stores the signature code data.

Figure 8:
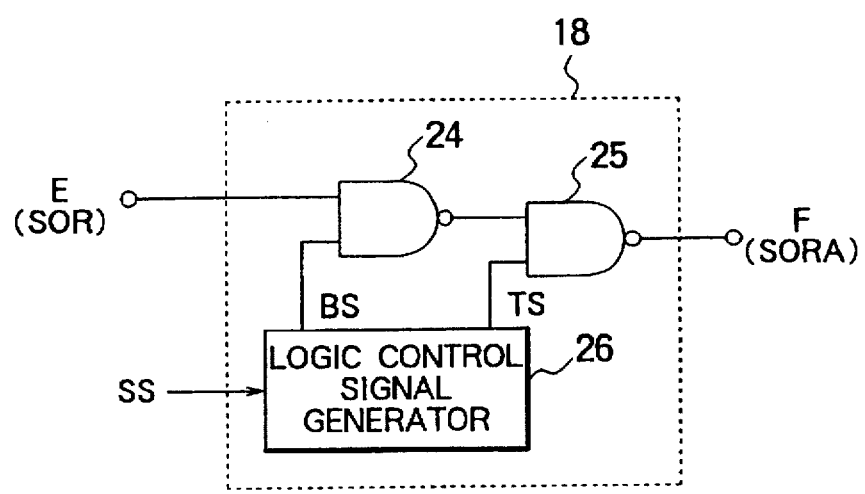
FIG. 8 is a circuit diagram of the logic control signal generator shown in FIG. 6.

Referring to FIG. 8 illustrating a circuit diagram of the signature code generator 18 shown in FIG. 6, the signature code generator 18 comprises a logic control signal generator 26 which generates a pair of signature logic control signals BS and TS in response to the mode detection signal SS supplied from the signature code read mode detector 19. The signature code generator 18 further comprises a selecting section formed of a first NAND gate 24 having a first input for receiving an output "E" from the redundant sense amplifier 17 and a second input for receiving the output BS from the logic control signal generator 26, and a second NAND gate 25 having a first input for receiving an output from the first NAND gate 24 and a second input for receiving an output TS from the logic control signal generator 26 to deliver a signal F to the transfer bank 21 at the output SORA. The selecting section selects one of the signal "E" supplied through the input (SOR) of the signature code generator 18 and the output "1" or "0" specified by the logic control signal generator 26.

During a time period other than the signature code read mode, i.e., during a normal operation mode including a test mode, the logic control signal generator 26 generates the signature logic control signals BS and TS both of a high level, whereby the signature code generator 18 selects as the output "F" thereof an output "E" supplied at the output SOR of the redundant sense amplifier 17.

During the signature code read mode, i.e., when the mode detection signal SS assumes a high level, the signature code generator 18 inactivates the signal "E" at the output SOR of the redundant sense amplifier 17 and delivers signal "T" at output SOR, which is stored in the memory cell in the test memory cell block. Specifically, the signal "F" at the output SORA of the signature code generator 18 is determined by the signature logic control signals BS and TS: hen the signature logic control signal TS assumes a low level, the signature code generator 18 delivers the output "F" of a high level independently from the signal "E" supplied from the redundant sense amplifier 17; and when the signature logic control signal BS assumes a low level while the signal TS assumes a high level, the signature code generator 18 delivers the signal "F" of a low level. Thus, which level is supplied as the signal "F" at the output SORA of the signature code generator 18 is determined by the signals TS and BS, which are determined by the specific configuration of the logic control signal generator 26 and the substitute signal including data as to which column of the memory sells is substituted for.

Figure 9:
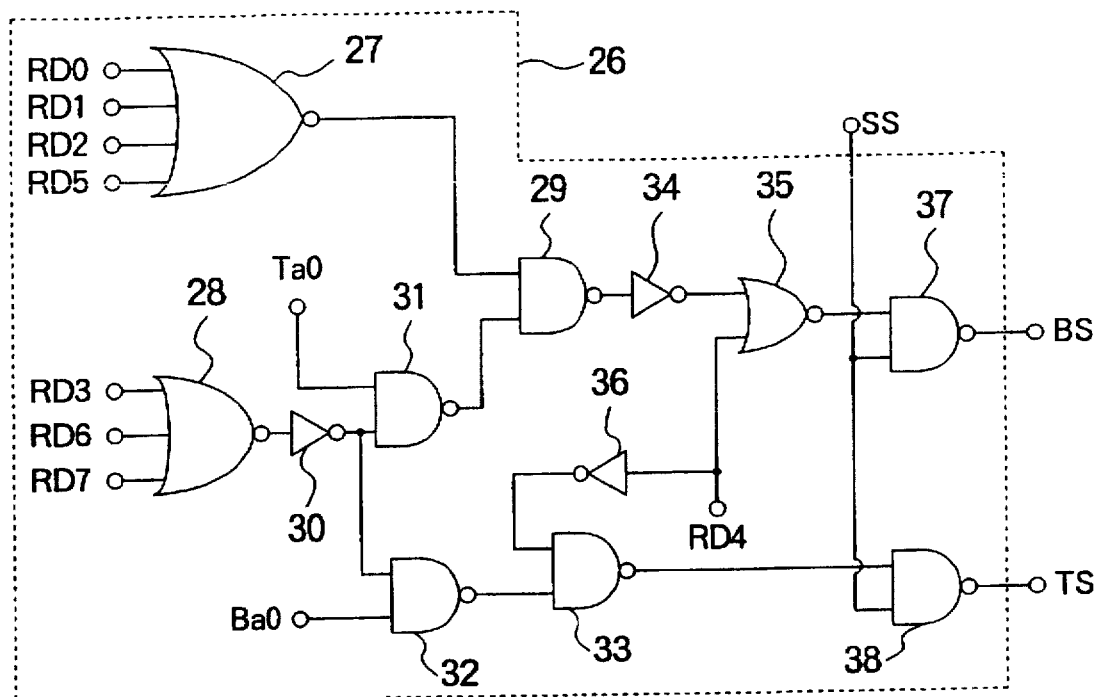
FIG. 9 is a logic diagram of the logic control signal generator shown in FIG. 8.

FIG. 9 shows an exemplified circuit diagram of the logic control signal generator 26 shown in FIG. 8, wherein RD0 to RD7 represent a defect bit identification signals, one of which assumes a high level when a corresponding column in the main memory cell block is substituted for by the memory cells in the redundant memory cell block. Ta0 and Ba0 represent an address signal and an inverted address signal. The identification signals RD0 to RD7 may be generated from the substitute signal in either the logic control signal generator 26 or outside the same within the signature code generator 18.

The logic control signal generator 26 comprises a four-input NOR gate 27 which receives identification signals RD0, RD1, RD2 and RD5 at the inputs thereof, a three-input NOR gate 28 which receives identification signals RD3, RD6 and RD7 at the inputs thereof, a NAND gate 31 having a first input for receiving an output from the NOR gate 28 through an inverter 30 and a second input for receiving the address signal Ta0, a NAND gate 32 having a first input for receiving an output from the inverter 30 and a second input for receiving signal Ba0, a NAND gate 29 for receiving outputs from NOR gate 27 and NAND gate 31 at inputs thereof, a NOR gate 35 having a first input for receiving an output from the NAND gate 29 through an inverter 34 and a second input for receiving identification signal RD4, a NAND gate 33 having a first input for receiving identification signal RD4 through an inverter 36 and a second input for receiving an output from NAND gate 32, and a pair of NAND gates 37 and 38 each having a first input for receiving the mode detection signal and a second input for which receiving an output from either NOR gate 35 or NAND gate 33.

Outputs from NAND gates 37 and 38 represent the signature logic control signals BS and TS, respectively. The exemplified configuration of the logic control signal generator 26 delivers a selected one of the bits in the signature code shown in FIG. 1, the selection being executed by the defect cell identification signal RD0 to RD7 one of which assumes a high level and remaining of which assumes a low level in accordance with the substitute signal.

Figures 1, 2:
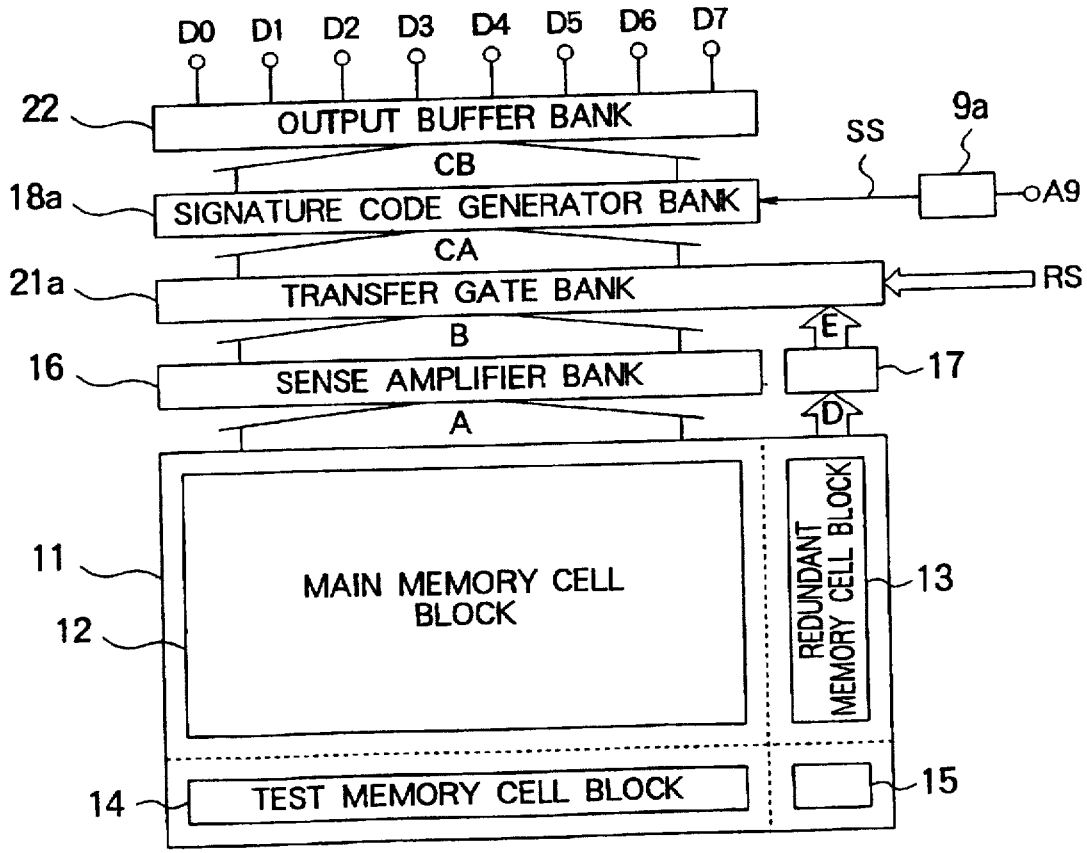
FIG. 1 is an example of a signature code including a maker code and a device code in a 8-bit EPROM.
FIG. 2 is a block diagram of a first conventional EPROM having a redundant memory cell block.
Figure 3:
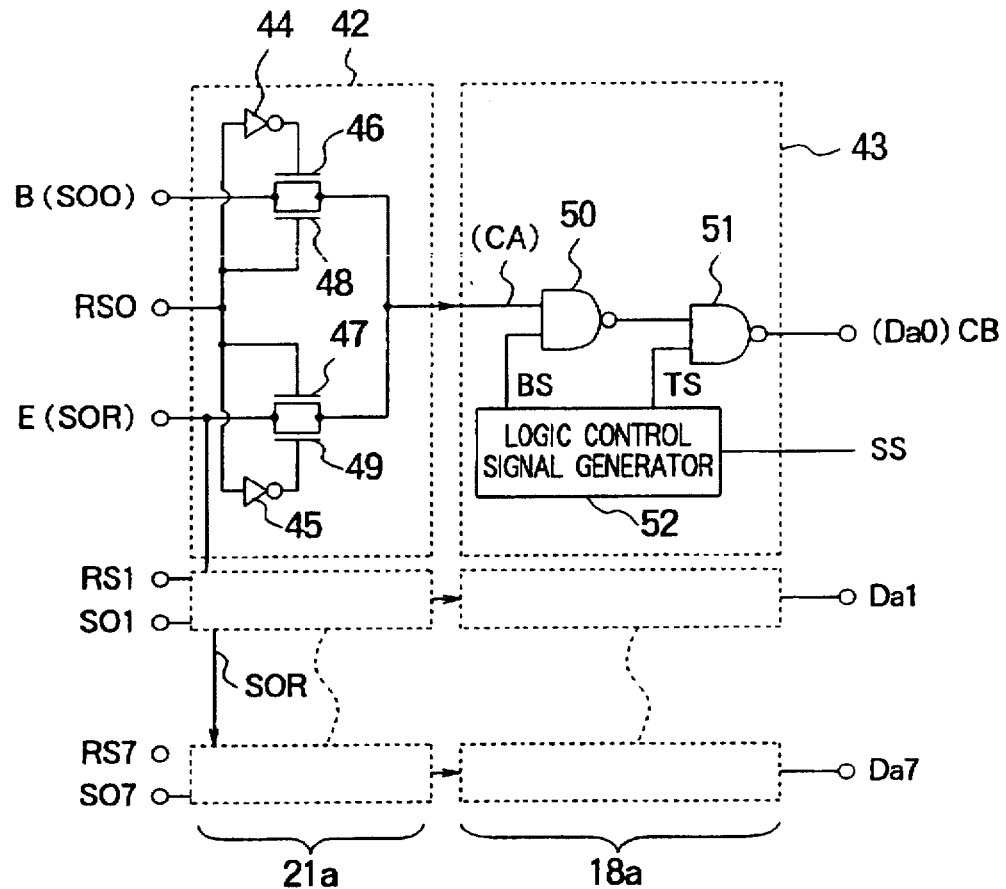
FIG. 3 is a circuit diagram of the transfer gate bank and signature code generator bank shown in FIG. 2.
Figure 4:
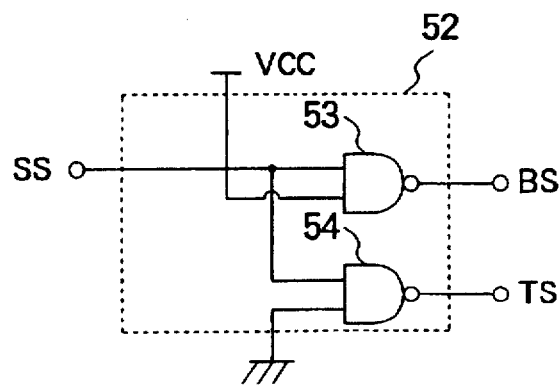
FIG. 4 is a circuit diagram of the control signal generator shown in FIG. 3.
Figure 5:
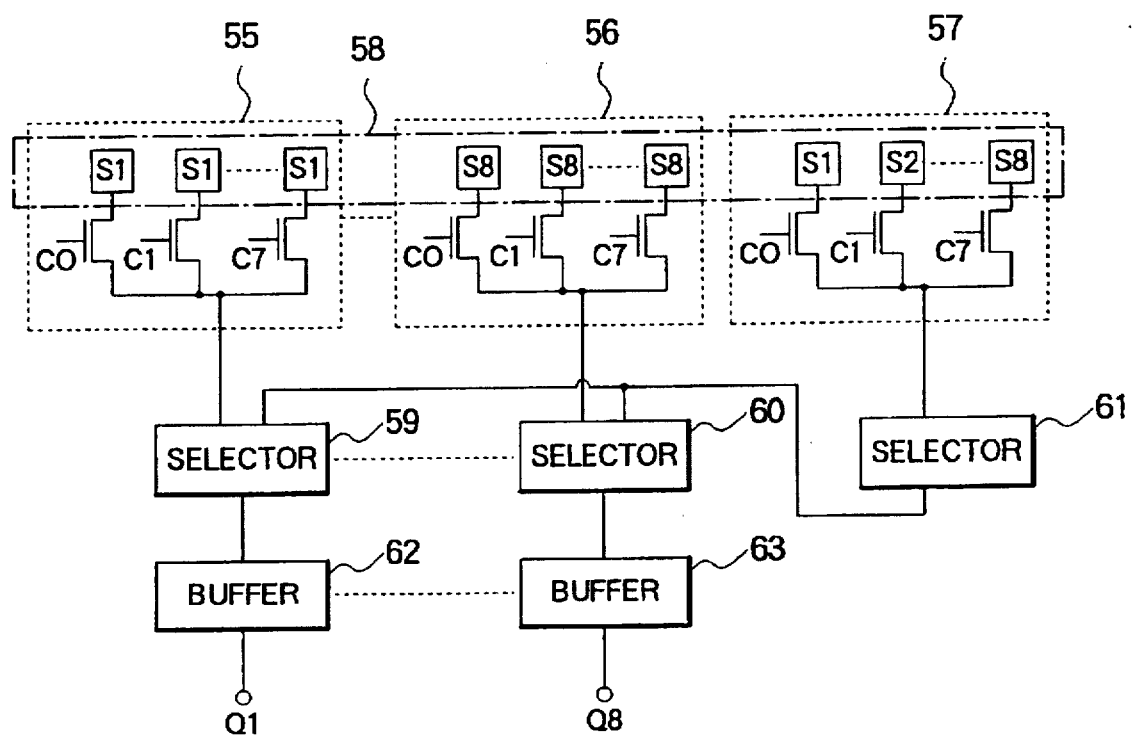
FIG. 5 is a block diagram of a second conventional EPROM having a redundant memory cell block.

Here, it is assumed for the description to follow that redundant memory cells in the redundant memory cell block is substituted for bit 0 shown in FIG. 1. It will be noted that bit 0 in FIG. 1 is implemented by an arrangement such that when A/0 pin assumes a low level, a maker code of a low level is delivered to the output pin D0, and when the A0 pin assumes a high level, a device code of a low level is also delivered to the output pin D0.

In operation of the logic control signal generator of 26 FIG. 9, signal RD0 assumes a high level and the remaining signals RD1 to RD7 assume a low level. When A0 pin assumes a low level, Ta0 and Ba0 assume a high level and a low level, respectively, and the mode detection signal SS assumes a high level. As a consequence, the signature logic control signals BS and TS assume a low and a high level, respectively. Consequently, the signature code generator 18 delivers at the output SORA thereof a signal "F" of a low level.

The transfer gate bank 21 shown in FIG. 6 receives normal data stored in the main memory cell block 12 and test memory cell block 14 through the sense amplifier bank 16 as well as redundant data delivered from the signature signal generator 18. The transfer bank 21 selects the data from the signature signal generator which is substituted for the data of the column in the main memory cell block and test memory cell block having a deficiency.

With the present embodiment, it is not necessary to provide a signature code generator bank having signature code generators in number corresponding to all the bits of a signature code. The signature code generator may be provided in number corresponding to the number of columns desired in the redundant memory cell block.

Figure 10:
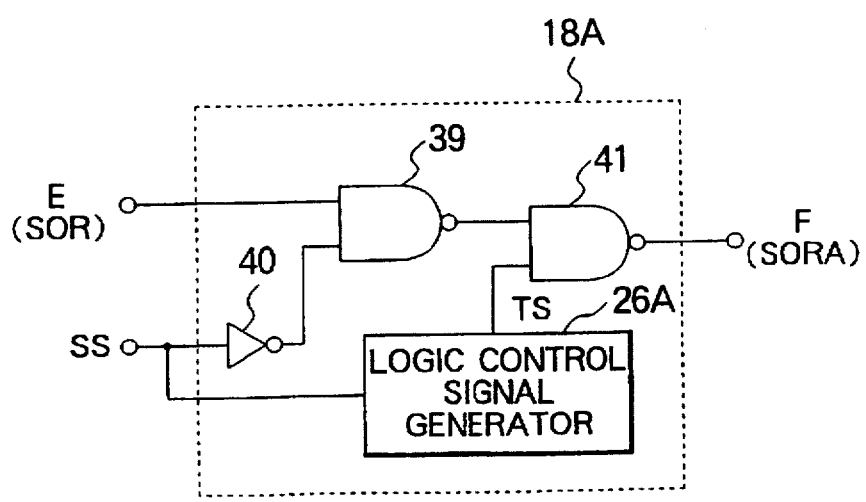
FIG. 10 is a circuit diagram of another example of the signature code generator shown in FIG. 6.

FIG. 10 shows another example for the signature code generator shown in FIG. 6. The signature code generator 18A in FIG. 10 comprises a logic control signal generator 26A for generating a signature logic control signal TS in response to the mode detection signal SS, and a selecting section including an inverter 40 for receiving the mode detection signal SS from the signature code read mode detector 19, a first NAND gate 39 having a first input for receiving a signal "E" from the redundant sense amplifier 17 and a second input for receiving an output from the inverter 40, a second NAND gate 41 having a first input for receiving an output from the second NAND gate 39 and a second input for receiving an output TS from the logic control signal generator 26A to deliver a signal "F" at the output SORA. With this configuration, the logic control signal generator 26A can be simplified because it is sufficient to generate only the output TS signal, as will be understood with reference to FIG. 9 which shows generator 26 for generating both the outputs BS and TS.

Although the present invention is described with reference to preferred embodiment thereof, the present invention is not limited thereto and it will be apparent from those skilled in the art that various modifications or alterations can be easily made without departing from the scope of the present invention as set forth in the appended claims.

What is claimed is:

1. A non-volatile semiconductor memory device comprising:

an array of non-volatile memory cells including a main memory cell block, a test memory cell block for storing a signature code, and a redundant memory cell block;

a signal read block including a first read section for reading data stored in the main memory cell block and the signature code stored in the test memory cell block, and a second read section for reading data stored in the redundant memory cell block;

a mode selector for selecting both a normal operation mode and a signature read mode of the memory device;

a signal generator including a substitute signal generator for generating a substitute signal indicating that a faulty memory cell group in the main memory cell block be substituted for by said redundant memory cell block, and a logic control signal generator for generating bits of the signature code based on the substitute signal during the signature read mode;

and a selecting block including a first selecting section for selecting one of an output from the first read section and an output from the second read section based on the substitute signal during the normal operation mode, and a second selecting section for selecting an output from said second read section or an output from the signature code generator dependently of the normal operation mode or signature code read mode.

2. A non-volatile semiconductor memory device as defined in claim 1, wherein the test memory cell block further stores a test pattern which is read during the normal operation mode by the first section.

3. A non-volatile semiconductor memory device as defined in claim 1, wherein the signature code includes a first code and a second code, and said logic control signal generator generates first signal and second signal for defining bits of first code and second code, respectively.

4. A non-volatile semiconductor memory device as defined in claim 1 wherein each of the memory cells in said test memory cell block stores said signature code by presence or absence of connection between a drain of the each of the memory cells and a corresponding bit line.

* * * * *